US012698599B2

(12) United States Patent
Seo et al.

(10) Patent No.:  US 12,698,599 B2
(45) Date of Patent:       Aug. 4, 2026

(54) SAFETY FENCE, TRANSFER DEVICE INCLUDING A SAFETY FENCE AND APPARATUS FOR PROCESSING A SUBSTRATE INCLUDING A SAFETY FENCE

(71) Applicant: SEMES CO., LTD., Cheonan-si (KR)

(72) Inventors: Eunho Seo, Cheonan-si (KR); Sangpyo Jun, Cheonan-si (KR); Sunghyup Baek, Daejeon (KR); Hyochul Kim, Sejong-si (KR); Inkwang Lee, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 828 days.

(21) Appl. No.: 18/146,588

(22) Filed: Dec. 27, 2022

(65) Prior Publication Data

US 2023/0203759 A1      Jun. 29, 2023

(30) Foreign Application Priority Data

Dec. 28, 2021     (KR) ........................ 10-2021-0189877

(51) Int. Cl.
*E01B 26/00*          (2006.01)
*B61B 5/02*          (2006.01)
(Continued)

(52) U.S. Cl.
CPC .............. *E01B 26/005* (2013.01); *B61B 5/02* (2013.01); *B65G 1/0457* (2013.01); *B65G 35/06* (2013.01);
(Continued)

(58) Field of Classification Search
CPC ............. E01B 26/005; H01L 21/67733; H01L 21/67763; H01L 21/67706; H01L 21/6773;
(Continued)

(56) References Cited

U.S. PATENT DOCUMENTS 10,221,578 B2 *   3/2019  Newman ................ B65G 43/00
11,772,685 B2 *  10/2023  Austrheim ........... B65G 1/0464
                                                                 414/278
(Continued)

FOREIGN PATENT DOCUMENTS

CN          106740883 A  *  5/2017  ............... B61D 1/06
CN          108652388 A  * 10/2018  ............. B65G 37/00
(Continued)

OTHER PUBLICATIONS

Office Action for Chinese Application No. 202211691646.X dated Mar. 29, 2025.

*Primary Examiner* — Cheng Lin
(74) *Attorney, Agent, or Firm* — Harness, Dickey & Pierce, P.L.C.

(57)          ABSTRACT

A transfer device may include a transfer part including transfer rails installed on a ceiling of a manufacturing line for an integrated circuit device and a transfer vehicle running along the transfer rails, and a safety fence disposed adjacent to the transfer part. The safety fence may include a plurality of first horizontal supporting portions disposed in parallel to the transfer rails, a plurality of second horizontal supporting portions connecting the plurality of first horizontal supporting portions to the transfer rails, a plurality of vertical supporting portions extended from the plurality of horizontal supporting portions, respectively, and a plate portion connected to the plurality of vertical supporting portions. The safety fence may be partially foldable and partially unfoldable.

17 Claims, 3 Drawing Sheets

(51) Int. Cl.
　　*B65G 1/04* 　　　　(2006.01)
　　*B65G 35/06* 　　　(2006.01)
　　*H10P 72/30* 　　　(2026.01)

(52) U.S. Cl.
　　CPC ...... *H10P 72/3202* (2026.01); *H10P 72/3218* (2026.01); *H10P 72/3221* (2026.01); *H10P 72/34* (2026.01); *B65G 2201/0297* (2013.01)

(58) Field of Classification Search
　　CPC ........ B61B 5/02; B65G 35/06; B65G 1/0457; B65G 2201/0297
　　See application file for complete search history.

(56) References Cited

U.S. PATENT DOCUMENTS

| | | | |
|---|---|---|---|
| 2020/0227283 A1 * | 7/2020 | Kuo | H01L 21/67733 |
| 2021/0362949 A1 * | 11/2021 | Morimoto | H01L 21/67715 |

FOREIGN PATENT DOCUMENTS

| | | | | |
|---|---|---|---|---|
| CN | 111441077 A | * | 7/2020 | C25D 17/00 |
| DE | 202019106369 U1 | * | 11/2019 | E01B 26/005 |
| KR | 100967357 B1 | | 7/2010 | |
| KR | 20140004779 U | * | 8/2014 | F16B 7/04 |
| KR | 200481304 Y1 | * | 9/2016 | F16P 1/02 |
| KR | 20190141407 A | * | 12/2019 | H01L 21/67733 |
| KR | 10-2021-0007448 A | | 1/2021 | |
| KR | 10-2021-0042379 A | | 4/2021 | |
| KR | 102241781 B1 | | 4/2021 | |

* cited by examiner

200

1

SAFETY FENCE, TRANSFER DEVICE INCLUDING A SAFETY FENCE AND APPARATUS FOR PROCESSING A SUBSTRATE INCLUDING A SAFETY FENCE

CROSS-REFERENCE TO RELATED APPLICATION

This application claims priority to Korean Patent Application No. 10-2021-0189877 filed on Dec. 28, 2021 in the Korean Intellectual Property Office (KIPO), the contents of which are herein incorporated by reference in its entirety.

BACKGROUND

1. Field

Example embodiments of the invention relate to a safety fence, a transfer device and an apparatus for processing a substrate. More particularly, example embodiments of the invention relate to a safety fence capable of protecting structures from an interference caused under a manufacturing line for an integrated circuit device and protecting underlying structures from falling of objects, a transfer device including such a safety fence, and an apparatus for processing a substrate including the safety fence.

2. Related Technology

In a manufacturing line for an integrated circuit device such as a semiconductor device or display device, a processing part for performing a predetermined process on a substrate is disposed and a transfer part for transferring articles used in the manufacturing of the integrated circuit device is installed.

In general, the transfer part including transfer rails and a transfer vehicle may be installed on a ceiling of the manufacturing line. When the transfer part is installed on the ceiling of the manufacturing line, the transfer part shall be protected from an interference caused under the manufacturing line, and also the underlying structures and operators shall be protected from the falling objects from the transfer part. To this end, a safety fence may be installed along the transfer rails of the transfer part. However, a recent processing part may have a height close to the ceiling of the manufacturing line such that the door of the process part may be properly opened and closed when the safety fence is adjacent to such a processing part.

SUMMARY

It is one object of the invention to provide a safety fence capable of capable of protecting structures from an interference caused under a manufacturing line for an integrated circuit device and protecting underlying structures from falling of objects.

It is another object of the invention to provide a transfer device including a safety fence capable of capable of protecting structures from an interference caused under a manufacturing line for an integrated circuit device and protecting underlying structures from falling of objects.

It is still another object of the invention to provide an apparatus for processing a substrate including a safety fence capable of capable of protecting structures from an interference caused under a manufacturing line for an integrated circuit device and protecting underlying structures from falling of objects.

According to an aspect of the invention, there is provided a safety fence in a manufacturing line for an integrated circuit device. The safety fence may include a plurality of first horizontal supporting portions disposed in parallel to transfer rails, a plurality of second horizontal supporting portions connecting the plurality of first horizontal supporting portions to the transfer rails; a plurality of vertical supporting portions extended from the plurality of horizontal supporting portions, respectively, and a plate portion connected to the plurality of vertical supporting portions. The safety fence may be partially foldable and partially unfoldable.

In example embodiments, each of the plurality of vertical supporting portion may include an upper vertical supporting portion and a lower vertical supporting portion. The upper vertical supporting portion and the lower vertical supporting portion may be separable from each other.

In some example embodiments, the safety fence may include two first horizontal supporting portions, six second horizontal supporting portions and six vertical supporting portions. Three of the second horizontal supporting portions may connect one of the first horizontal supporting portions to one of the transfer rails, and three of the vertical supporting portions may extend from one of the first horizontal supporting portions.

In example embodiments, when the safety fence is partially folded, some of the upper vertical supporting portions and some of the lower vertical supporting portions may be connected to each other, and others of the upper vertical supporting portions and others of lower vertical supporting portions may be separated from each other.

In some example embodiments, the upper vertical supporting portions and the lower vertical supporting portions may be connected to each other and separated from each other in a sliding coupling method, a screw coupling method, or a lever coupling method.

In some example embodiments, the safety fence may be composed of one or more supporting module including the first horizontal supporting portions, the second horizontal supporting portions, the vertical supporting portions, and the plate portion.

According to another aspect of the invention, there is provided a transfer device. The transfer device may include a transfer part including transfer rails installed on a ceiling of a manufacturing line for an integrated circuit device and a transfer vehicle running along the transfer rails, and a safety fence disposed adjacent to the transfer part. The safety fence may include a plurality of first horizontal supporting portions disposed in parallel to the transfer rails, a plurality of second horizontal supporting portions connecting the plurality of first horizontal supporting portions to the transfer rails, a plurality of vertical supporting portions extended from the plurality of horizontal supporting portions, respectively, and a plate portion connected to the plurality of vertical supporting portions. The safety fence may be partially foldable and partially unfoldable.

In example embodiments, each of the plurality of vertical supporting portion may include an upper vertical supporting portion and a lower vertical supporting portion. In some example embodiments, the upper vertical supporting portions and the lower vertical supporting portions may be connected to each other and separated from each other in a sliding coupling method, a screw coupling method, or a lever coupling method.

In example embodiments, when the safety fence is partially folded, some of the upper vertical supporting portions and some of the lower vertical supporting portions may be connected to each other, and others of the upper vertical supporting portions and others of lower vertical supporting portions may be separated from each other.

In example embodiments, each of the lower vertical supporting portions may have a length substantially longer than a length of each of the upper vertical supporting portion.

In some example embodiments, the safety fence may include two first horizontal supporting portions, six second horizontal supporting portions and six vertical supporting portions. Three of the second horizontal supporting portions may connect one of the first horizontal supporting portions to one of the transfer rails, and three of the vertical supporting portions may extend from one of the first horizontal supporting portions.

In some example embodiments, the safety fence may be composed of one or more supporting module including the first horizontal supporting portions, the second horizontal supporting portions, the vertical supporting portions, and the plate portion.

According to a still another aspect of the invention, there is provided an apparatus for processing a substrate. The apparatus for processing a substrate may include a processing part disposed in a manufacturing line for an integrated circuit device, the processing part including a hinged door, and a transfer part including transfer rails installed on a ceiling of the manufacturing line and a transfer vehicle running along the transfer rails, and a safety fence disposed adjacent to the transfer part. The safety fence may include a plurality of first horizontal supporting portions disposed in parallel to the transfer rails, a plurality of second horizontal supporting portions connecting the plurality of first horizontal supporting portions to the transfer rails, a plurality of vertical supporting portions extended from the plurality of horizontal supporting portions, respectively, and a plate portion connected to the plurality of vertical supporting portions. The safety fence may be partially foldable such that the safety fence may not affect on an opening and closing of the door of the processing part.

In example embodiments, each of the plurality of vertical supporting portion may include an upper vertical supporting portion and a lower vertical supporting portion. The upper vertical supporting portions and the lower vertical supporting portions may be connected to each other and separated from each other in a sliding coupling method, a screw coupling method, or a lever coupling method.

In example embodiments, when the safety fence is partially folded, some of the upper vertical supporting portions and some of the lower vertical supporting portions may be connected to each other, and others of the upper vertical supporting portions and others of lower vertical supporting portions may be separated from each other.

In example embodiments, each of the lower vertical supporting portions may have a length substantially longer than a length of each of the upper vertical supporting portion.

In some example embodiments, the safety fence may include two first horizontal supporting portions, six second horizontal supporting portions and six vertical supporting portions. Three of the second horizontal supporting portions may connect one of the first horizontal supporting portions to one of the transfer rails, and three of the vertical supporting portions may extend from one of the first horizontal supporting portions.

In some example embodiments, the safety fence may be composed of one or more supporting module including the first horizontal supporting portions, the second horizontal supporting portions, the vertical supporting portions, and the plate portion.

According to example embodiments, the apparatus for processing a substrate may include the transfer device having the partially foldable and unfoldable safety fence such that the apparatus for processing a substrate may effectively protect the underlying structures and the operators from the falling of the object from the ceiling of the manufacturing line, and also may sufficiently prevent the interference caused under the manufacturing line. Additionally, the safety fence may not affect the opening and closing of the door of the processing part so that the efficiency of the apparatus for processing a substrate may be improved.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
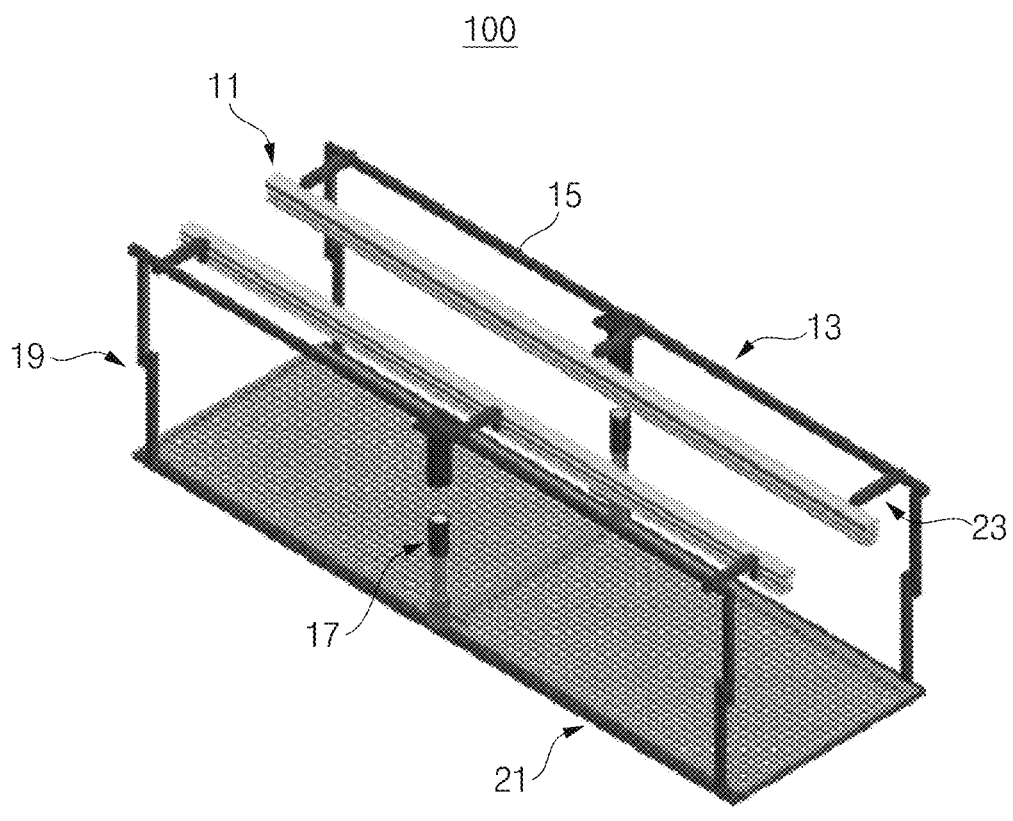
FIG. 1 is a schematic perspective view illustrating a transfer device including a safety fence in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/ or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
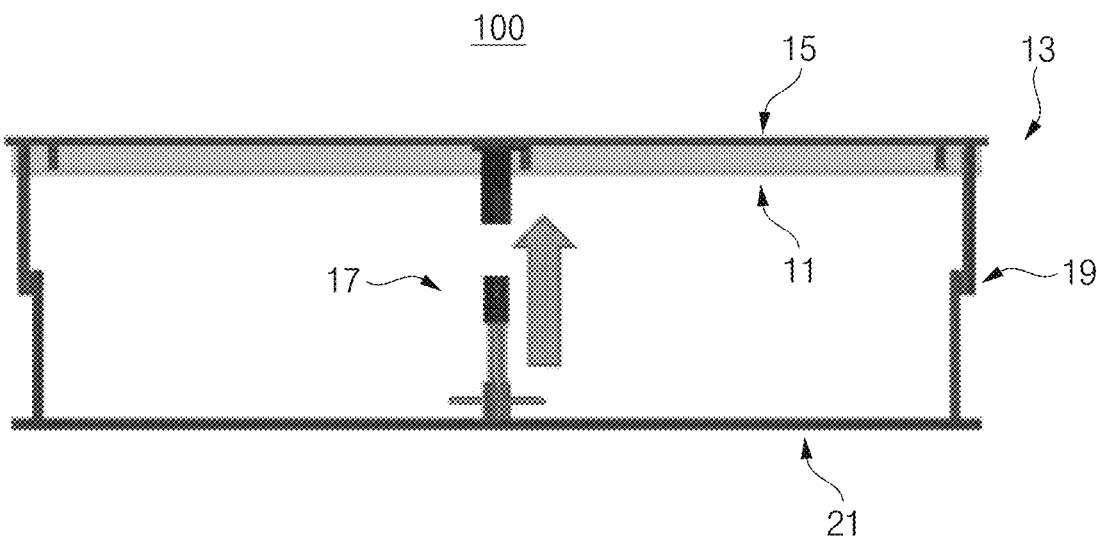
FIGS. 2 and 3 are schematic cross-sectional views illustrating a transfer device including a safety fence in accordance with example embodiments of the invention.
Figure 3:
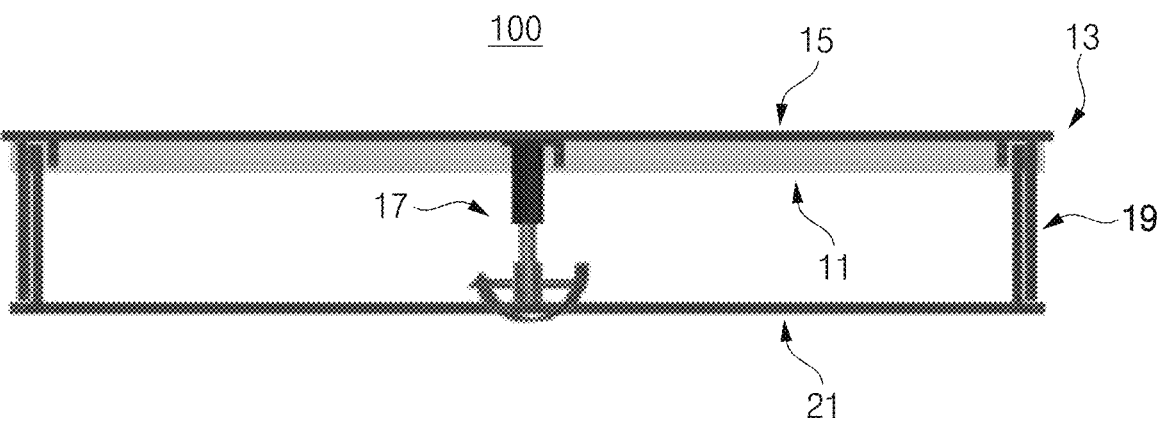

FIG. 1 is a schematic perspective view illustrating a transfer device including a safety fence in accordance with example embodiments of the invention. FIGS. 2 and 3 are schematic cross-sectional views illustrating a transfer device including a safety fence in accordance with example embodiments of the invention.

Referring to FIG. 1, a transfer device 100 according to example embodiments may include a safety fence 13 and a transfer part 11. The safety fence 13 may be disposed adjacent to the transfer part 11.

The transfer part 11 may accommodate articles used in manufacturing of an integrated circuit device and may transfer the articles to desired positions. The transfer part 11 may be installed on a ceiling of a manufacturing line for the integrated circuit device. In example embodiments, the transfer part 11 may include a transfer rail and a transfer vehicle. The transfer rail may provide a transfer pathway in which the articles are transferred and the transfer vehicle may run on the transfer rail along the transfer pathway. The articles may be received in the transfer vehicle. Examples of the articles may include, but not limited to, a front opening unified pod (FOUP), a front opening shipping box (FOSB), etc. The transfer part 11 may include a pair of transfer rails substantially faced each other. The transfer vehicle may include a receiving part for accommodating the articles and running wheels for moving along the transfer rails.

In example embodiments, the safety fence 13 may be disposed in the manufacturing line for the integrated circuit device such as a semiconductor device or a display device. Particularly, the safety fence 13 may protect the ceiling of the manufacturing line and the structures on the manufacturing line from the interference under the manufacturing line. Further, the safety fence 13 may protect the underlying structures and the operators from objects falling from the ceiling of the manufacturing line. For example, when the transfer part 11 is disposed on the ceiling of the manufacturing line, the transfer part 11 shall be protected by the interference generated under the manufacturing line and also the underlying structures and the operators shall be protected from the falling of the objects from the transfer part 11. To this end, the safety fence 13 may be disposed around the transfer part 11 along the transfer rail.

Figure 4:
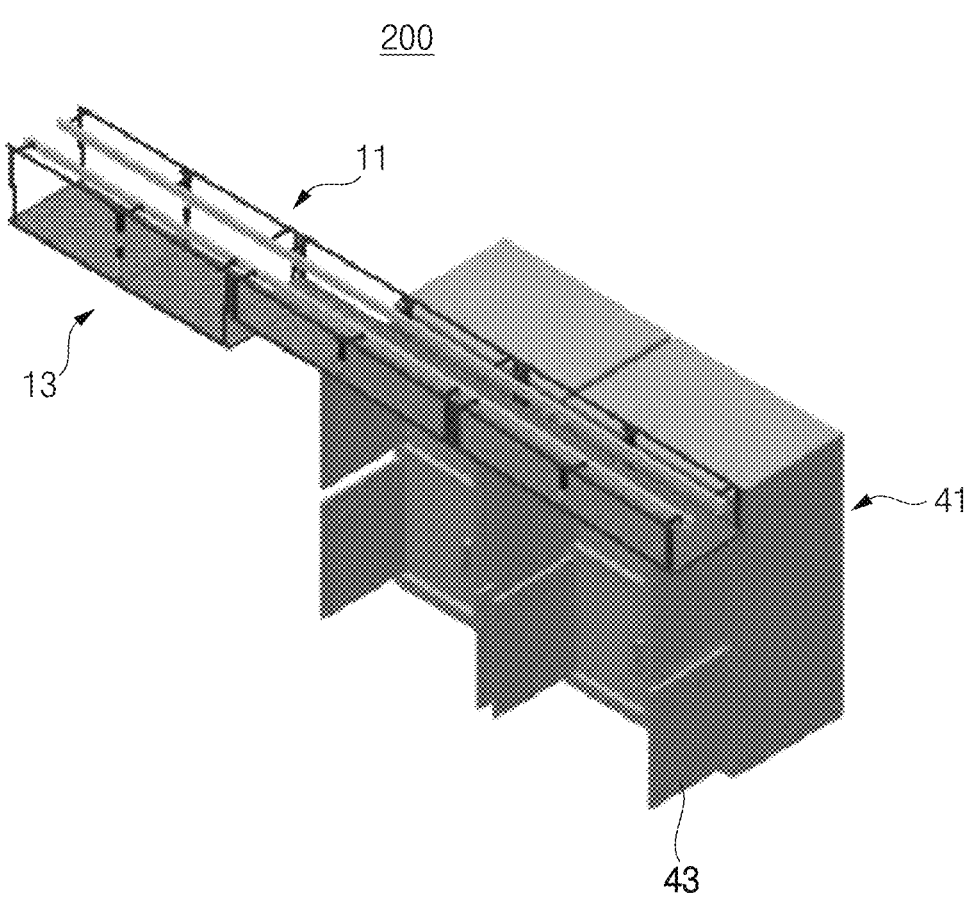
FIG. 4 is a schematic perspective view illustrating an apparatus for processing a substrate including a safety fence in accordance with example embodiments of the invention.

FIG. 4 is a schematic perspective view illustrating an apparatus for processing a substrate including a safety fence in accordance with example embodiments of the invention.

Referring to FIG. 4, an apparatus for processing a substrate 200 according to example embodiments may include the safety fence 13 having the above structure, the transfer 11 protected by the safety fence 13 and a processing part 41 for performing a predetermined treatment about a substrate. In example embodiments, the processing part 41 may include a hinged door 43. Here, the processing part 41 may have a height being close to the ceiling of the manufacturing line so as to manufacture a recent display device having relatively large dimensions. The processing part 41 may include, but not limited to, a cabinet, a stocker, etc.

As illustrated in FIG. 4, the transfer device 100 including the safety fence 13 may be locates adjacent to the processing part 41 such that the articles may be transferred from the transfer part 11 to the processing part 41. However, the door 43 of the processing part 41 may not sufficiently opened by the adjacent safety fence 13 when the processing part 41 of the apparatus for processing a substrate 200 has the height close to the ceiling of the manufacturing line. Considering such a problem, the safety fence 13 according to example embodiments may have the configuration that may not have an effect on the opening and closing of the door 43 of the processing part 41.

In example embodiments, the safety fence 13 may have a folding configuration as illustrated in FIGS. 2 and 3. Specifically, the safety fence 13 may include a portion that may be folded toward the ceiling of the manufacturing line adjacent to the process part 41. That is, the safety fence 13 may be partially folded in an upward direction when the safety fence 13 is adjacent to the door 43 of the processing part 41. As such, the safety fence 13 may not disturb the opening and closing of the door 43 when the safety fence 13 is in a partially folded state. In this, other portions of the safety fence 13 may be in an unfolded state.

Referring to FIGS. 1 to 3, the safety fence 13 may include a first horizontal portion 15, a second horizontal supporting portion 23, vertical supporting portions 17 and 19, and a plate portion 21.

The first horizontal supporting portions 15 may be disposed in substantially parallel to the transfer rails of the transfer part 11, respectively, and may be separated from the transfer rails by predetermined distances. The second horizontal supporting portions 23 may be disposed between the first horizontal supporting portions 15 and the transfer rails, respectively. The second horizontal supporting portions 23 may connect the first horizontal supporting portions 15 to the transfer rails. As illustrated in FIG. 1, each of the second horizontal supporting portions 23 may be extended from each of the first horizontal supporting portions 15. For example, two second horizontal supporting portions 23 may connect one first horizontal supporting portion 15 to one transfer rail. However, the number of the second horizontal supporting portions 23 may be increased or decreased in accordance with the structure/dimensions of the safety fence 13.

The vertical supporting portions 17 and 19 may be extended from the first horizontal supporting portions 15 in a downward direction relative to ceiling of the manufacturing line, respectively. In this case, each of the second horizontal supporting portions 23 may be substantially corresponded to each of the vertical supporting portions 17 and 19 to improve the structural stability of the safety fence 13. The first horizontal supporting portions 15 and the vertical supporting portions 17 and 19 are connected to the plate portion 21. The plate portion 21 may protect the transfer part 11 from the interference caused under the manufacturing line, and also may prevent the structures under the transfer part 11 from being damaged by the falling of the objects from the transfer part 11. For example, the plate portion 21 may have a net structure to reduce the weight of the safety fence 13.

According to example embodiments, the safety fence 13 may be folded in the upward direction and unfolded in the downward direction by adjusting the vertical supporting portions 17 and 19. Specifically, the safety fence 13 may include a plurality of first horizontal supporting portions 15 and a plurality of vertical supporting portions 15 and 17. The plurality of vertical supporting portions 15 and 17 may be respectively extended from the plurality of first horizontal supporting portions 15 in the downward direction relative to the ceiling of the manufacturing line. Each of the plurality of vertical supporting portions 15 and 17 may include an upper vertical supporting portion and a lower vertical supporting portion. In this case, the upper vertical supporting portion and the lower vertical supporting portion may be separably coupled each other. Further, the lower vertical supporting portion may have a length substantially longer than a length of the upper vertical supporting portion. In other words, the upper and lower vertical supporting portions of some vertical supporting portions 17 and 19 adjacent to the processing part 41 are coupled to each other when the safety fence 13 is in the folded state as illustrated in FIG. 3. In contrast, when the safety fence 13 is in the unfolded state as illustrated in FIG. 2, the upper and lower vertical supporting portions of some vertical supporting portions 17 and 19 away from the processing part 41 are separated from each other.

For example, as illustrated in FIG. 4, the upper and lower vertical supporting portions of three vertical supporting portions 17 and 19 may be separated from each other whereas the upper and lower vertical supporting portions of six vertical supporting portions 17 and 19 may be coupled to each other when the safety fence 13 includes nine vertical supporting portions 17 and 19. However, the numbers of the separated vertical supporting portions and the coupled vertical supporting portions may vary in accordance with the structure/dimensions of the processing part 41 and/or the structure/dimensions of the transfer device 100. Here, the upper vertical supporting portions may be coupled to and separated from the lower vertical supporting portions in a sliding coupling method, a screw coupling method and/or a lever coupling method.

In some example embodiments, as illustrated in FIG. 1, the upper and lower vertical supporting portions of some vertical supporting portions 19 may be connected and separated in the sliding coupling method whereas the upper and lower vertical supporting portions of other vertical supporting portions 17 may be connected and separated in the screw coupling method. For example, when the safety fence 13 includes three vertical supporting portions 17 and 19, the upper and lower vertical supporting portions of side vertical supporting portions 19 may be connected and separated in the sliding coupling method whereas the upper and lower vertical supporting portions of a central vertical supporting portion 17 may be connected and separated in the screw coupling method. In this case, the upper and lower vertical supporting portions combined in the screw method may stably maintain the folded and unfolded states of the safety fence 13.

In other example embodiments, as illustrated in FIGS. 2 and 3, the upper and lower vertical supporting portions of some vertical supporting portions 19 may be connected and separated in the sliding coupling method whereas the upper and lower vertical supporting portions of other vertical supporting portions 17 may be connected and separated in the lever coupling method. For example, when the safety fence 13 includes three vertical supporting portions 17 and 19, the upper and lower vertical supporting portions of side vertical supporting portions 19 may be connected and separated in the sliding coupling method whereas the upper and lower vertical supporting portions of a central vertical supporting portion 17 may be connected and separated in the lever coupling method. Here, the upper and lower vertical supporting portions combined in the lever method may more stably maintain the folded and unfolded states of the safety fence 13.

In other example embodiments, the safety fence 13 may include vertical supporting portions 17 and 19 having linear motion (LM) guide structures. In other words, the lower vertical supporting portions of the vertical supporting portions 17 and 19 may have the LM guide structures whereas the upper vertical supporting portions of the vertical supporting portions 17 and 19 may have frame structures that may slide by the LM guide structures, respectively. Therefore, the safety fence 13 may be smoothly and stably folded and unfolded by the vertical supporting portions 17 and 19.

In example embodiments, the safety fence 13 may be composed of one or more supporting unit. For example, the supporting unit may include two first horizontal supporting portions 15, six second horizontal supporting portions 23, six vertical supporting portions 17 and 19, and one plate portion 21. In other words, the safety fence 13 may consist of one or more supporting module including the supporting portions and the plate portion.

As described above, the apparatus for processing a substrate 200 may include the transfer device 100 having the partially foldable and unfoldable safety fence 13 such that the apparatus for processing a substrate 200 may effectively protect the underlying structures and the operators from the falling of the object from the ceiling of the manufacturing line, and also may sufficiently prevent the interference caused under the manufacturing line. Further, the safety fence 13 may not affect the opening and closing of the door 43 of the processing part 41 so that the efficiency of the apparatus for processing a substrate 200 may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A safety fence in a manufacturing line for an integrated circuit device, which comprises:
    a plurality of first horizontal supporting portions disposed in parallel to transfer rails;
    a plurality of second horizontal supporting portions connecting the plurality of first horizontal supporting portions to the transfer rails;
    a plurality of vertical supporting portions extended from the plurality of horizontal supporting portions, respectively; and
    a plate portion connected to the plurality of vertical supporting portions,
    wherein the safety fence is partially foldable and partially unfoldable, each of the plurality of vertical supporting portion including an upper vertical supporting portion and a lower vertical supporting portion, and the upper vertical supporting portion and the lower vertical supporting portion are separable from each other.

2. The safety fence of claim 1, wherein the safety fence comprises two first horizontal supporting portions, six second horizontal supporting portions and six vertical supporting portions, and wherein three of the second horizontal supporting portions connect one of the first horizontal supporting portions to one of the transfer rails, and three of the vertical supporting portions extend from one of the first horizontal supporting portions.

3. The safety fence of claim 1, wherein when the safety fence is partially folded, some of the upper vertical supporting portions and some of the lower vertical supporting portions are connected to each other, and others of the upper vertical supporting portions and others of lower vertical supporting portions are separated from each other.

4. The safety fence of claim 3, wherein the upper vertical supporting portions and the lower vertical supporting portions are connected to each other and separated from each other in a sliding coupling method, a screw coupling method, or a lever coupling method.

5. The safety fence of claim 1, wherein the safety fence is composed of one or more supporting module including the first horizontal supporting portions, the second horizontal supporting portions, the vertical supporting portions, and the plate portion.

6. A transfer device comprising:
    a transfer part including transfer rails installed on a ceiling of a manufacturing line for an integrated circuit device and a transfer vehicle running along the transfer rails; and
    a safety fence disposed adjacent to the transfer part, the safety fence comprising: a plurality of first horizontal supporting portions disposed in parallel to the transfer rails;
        a plurality of second horizontal supporting portions connecting the plurality of first horizontal supporting portions to the transfer rails;
        a plurality of vertical supporting portions extended from the plurality of horizontal supporting portions, respectively; and
        a plate portion connected to the plurality of vertical supporting portions,
    wherein the safety fence is partially foldable and partially unfoldable
    each of the plurality of vertical supporting portion including an upper vertical supporting portion and a lower vertical supporting portion, and the upper vertical supporting portion and the lower vertical supporting portion are separable from each other.

7. The transfer device of claim 6, wherein the upper vertical supporting portions and the lower vertical supporting portions are connected to each other and separated from each other in a sliding coupling method, a screw coupling method, or a lever coupling method.

8. The transfer device of claim 7, wherein when the safety fence is partially folded, some of the upper vertical supporting portions and some of the lower vertical supporting portions are connected to each other, and others of the upper vertical supporting portions and others of lower vertical supporting portions are separated from each other.

9. The transfer device of claim 8, wherein each of the lower vertical supporting portions has a length longer than a length of each of the upper vertical supporting portion.

10. The transfer device of claim 6, wherein the safety fence comprises two first horizontal supporting portions, six second horizontal supporting portions and six vertical supporting portions, and wherein three of the second horizontal supporting portions connect one of the first horizontal supporting portions to one of the transfer rails, and three of the vertical supporting portions extend from one of the first horizontal supporting portions.

11. The transfer device of claim 10, wherein the safety fence is composed of one or more supporting module including the first horizontal supporting portions, the second horizontal supporting portions, the vertical supporting portions, and the plate portion.

12. An apparatus for processing a substrate comprising:
    a processing part disposed in a manufacturing line for an integrated circuit device, the processing part including a hinged door; and
    a transfer part including transfer rails installed on a ceiling of the manufacturing line and a transfer vehicle running along the transfer rails; and
    a safety fence disposed adjacent to the transfer part, the safety fence comprising:
        a plurality of first horizontal supporting portions disposed in parallel to the transfer rails;

a plurality of second horizontal supporting portions connecting the plurality of first horizontal supporting portions to the transfer rails;

a plurality of vertical supporting portions extended from the plurality of horizontal supporting portions, respectively; and a plate portion connected to the plurality of vertical supporting portions, wherein the safety fence is partially foldable such that the safety fence does not affect on an opening and closing of the door of the processing part each of the plurality of vertical supporting portion including an upper vertical supporting portion and a lower vertical supporting portion, and the upper vertical supporting portion and the lower vertical supporting portion are separable from each other.

13. The apparatus for processing a substrate of claim 12, wherein the upper vertical supporting portions and the lower vertical supporting portions are connected to each other and separated from each other in a sliding coupling method, a screw coupling method, or a lever coupling method.

14. The apparatus for processing a substrate of claim 13, wherein when the safety fence is partially folded, some of the upper vertical supporting portions and some of the lower vertical supporting portions are connected to each other, and others of the upper vertical supporting portions and others of lower vertical supporting portions are separated from each other.

15. The apparatus for processing a substrate of claim 14, wherein each of the lower vertical supporting portions has a length longer than a length of each of the upper vertical supporting portion.

16. The apparatus for processing a substrate of claim 12, wherein the safety fence comprises two first horizontal supporting portions, six second horizontal supporting portions and six vertical supporting portions, and wherein three of the second horizontal supporting portions connect one of the first horizontal supporting portions to one of the transfer rails, and three of the vertical supporting portions extend from one of the first horizontal supporting portions.

17. The apparatus for processing a substrate of claim 16, wherein the safety fence is composed of one or more supporting module including the first horizontal supporting portions, the second horizontal supporting portions, the vertical supporting portions, and the plate portion.

* * * * *